(12) United States Patent
Ausserlechner

(10) Patent No.: US 7,956,604 B2
(45) Date of Patent: Jun. 7, 2011

(54) INTEGRATED SENSOR AND MAGNETIC FIELD CONCENTRATOR DEVICES

(75) Inventor: Udo Ausserlechner, Villach (AT)

(73) Assignee: Infineon Technologies, AG, Neubiberg (DE)

( * ) Notice: Subject to any disclaimer, the term of this patent is extended or adjusted under 35 U.S.C. 154(b) by 373 days.

(21) Appl. No.: 12/169,746

(22) Filed: Jul. 9, 2008

(65) Prior Publication Data

US 2010/0007339 A1    Jan. 14, 2010

(51) Int. Cl.
*G01R 33/00* (2006.01)
(52) U.S. Cl. ........... 324/207.21; 324/207.2; 324/207.25; 324/251; 324/252; 324/165
(58) Field of Classification Search ............. 324/207.21, 324/207.2, 207.25, 251, 252, 165
See application file for complete search history.

(56) References Cited

U.S. PATENT DOCUMENTS

| | | | |
|---|---|---|---|
| 5,793,200 A * | 8/1998 | Berrill | ......................... 324/207.2 |
| 6,545,462 B2 | 4/2003 | Schott et al. | |
| 7,112,957 B2 | 9/2006 | Bicking | |
| 7,235,969 B2 | 6/2007 | Tondra | |
| 2007/0200564 A1 | 8/2007 | Motz et al. | |

FOREIGN PATENT DOCUMENTS

| | | |
|---|---|---|
| DE | 10314602 A1 | 10/2004 |
| DE | 102004060298 A1 | 6/2006 |
| WO | 2006037695 A1 | 4/2006 |

* cited by examiner

*Primary Examiner* — Reena Aurora
(74) *Attorney, Agent, or Firm* — Patterson Thuente Christensen Pedersen, P.A.

(57) ABSTRACT

Embodiments of the invention are related to integrated sensor and magnetic concentrator devices and methods. In one embodiment, an integrated circuit comprises a sensor device and a magnetic field concentrator. The sensor device comprises a first sensor element, a second sensor element, and a third sensor element, the first sensor element spaced apart from the third sensor element by a first gap, and the second sensor element spaced apart from the third sensor element by a second gap. The magnetic field concentrator comprises a first magnetic element disposed in the first gap and a second magnetic element disposed in the second gap.

23 Claims, 2 Drawing Sheets

INTEGRATED SENSOR AND MAGNETIC FIELD CONCENTRATOR DEVICES

BACKGROUND

To detect the speed and direction of a rotating wheel or other object, it is common practice to attach a magnetically polarized ring to the wheel and position a magnetic field sensor nearby. As the alternating magnetic poles (north, south, north, south, etc.) pass by during rotation, the field sensor detects and converts the pole-sequence into a pulsed output voltage. The rotational speed of the wheel can then be derived by counting the pulses per second.

In order to obtain fine resolution, many poles on the ring are desired. Unfortunately, the magnetic field of the poles does not extend far beyond the ring itself; in fact, it decreases exponentially with the distance from the ring. The field typically disappears almost entirely at a distance that is about two to three pole-pitches away from the ring, where the pole-pitch is the distance between the centers of two adjacent poles on the ring.

Because of assembly tolerances, the distance between the field sensor and the pole-ring may vary. Thus, there is a need for a magnetic field sensor system that is compatible with both small (e.g., about 0.5 mm) and large distances (e.g., up to about several millimeters), in other words a magnetic field sensor that is sensitive to small magnetic fields.

SUMMARY

Embodiments of the invention are related to integrated sensor and magnetic concentrator devices and methods. In one embodiment, an integrated circuit comprises a sensor device and a magnetic field concentrator. The sensor device comprises a first sensor element, a second sensor element, and a third sensor element, the first sensor element spaced apart from the third sensor element by a first gap, and the second sensor element spaced apart from the third sensor element by a second gap. The magnetic field concentrator comprises a first magnetic element disposed in the first gap and a second magnetic element disposed in the second gap.

In another embodiment, an integrated circuit comprises a first sensor element, a second sensor element spaced apart from the first sensor element, a third sensor element arranged between the first and second sensor elements, a first magnetic element arranged between the first and third sensor elements, and a second magnetic element arranged between the second and third sensor elements and forming a magnetic field concentrator in combination with the first magnetic element.

In a further embodiment, an integrated circuit comprises a sensor device and a magnetic field concentrator. The sensor device comprises at least two sensor elements spaced apart from each other on a die to form a first gap. The magnetic field concentrator is disposed in the first gap and configured to guide magnetic flux from an external source in a direction perpendicular to the at least two sensor elements.

In yet another embodiment, a method is disclosed. An integrated circuit comprising a sensor and a magnetic field concentrator is provided. The integrated circuit is exposed to a magnetic field. A magnetic flux is guided perpendicularly to the sensor by the magnetic field concentrator.

BRIEF DESCRIPTION OF THE DRAWINGS

The invention may be more completely understood from the following detailed description of various embodiments in connection with the accompanying drawings, in which.

Figure 1:
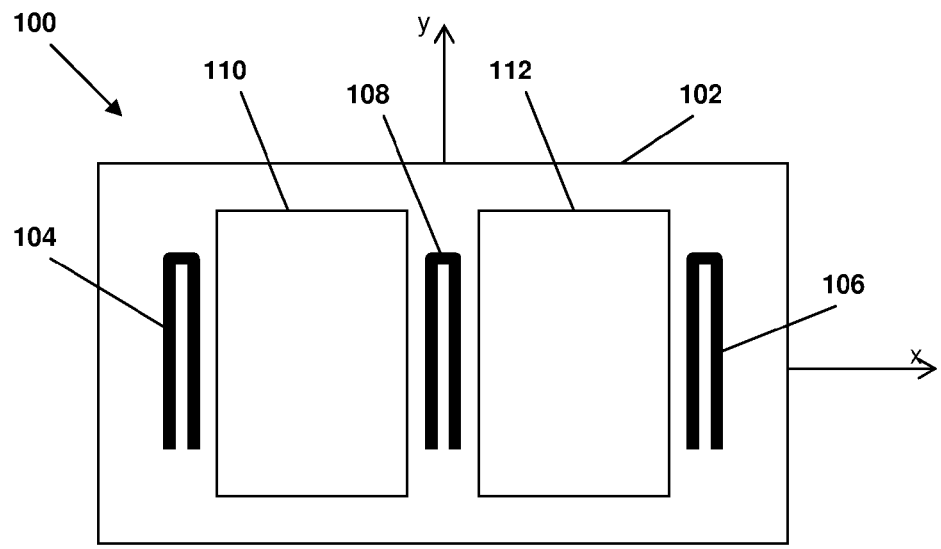
FIG. 1 is a top view of a block diagram of a sensor according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments of the invention relate to magnetic sensor devices, such as Hall, giant magnetoresistive (GMR), and others. Embodiments of the invention integrate magnetic field concentrators and magnetic sensor devices, thereby increasing the magnetic sensitivity of the sensor devices. Various embodiments of the invention can be more readily understood by reference to FIGS. 1-4 and the following description. While the invention is not necessarily limited to the specifically depicted application(s), the invention will be better appreciated using a discussion of exemplary embodiments in specific contexts.

Referring to FIG. 1, a sensor device 100 is depicted. Sensor device 100 comprises a die 102 on which additional sensor elements are mounted and/or formed. In one embodiment, sensor device 100 comprises first, second and third sensor elements 104, 106 and 108 and first and second magnetic elements 110 and 112.

In one embodiment, first and second sensor elements 104 and 106 comprise speed GMR sensor elements and third sensor element 108 comprises a direction GMR sensor element. In other embodiments, sensor device 100 comprises one or more Hall sensor elements, xMR sensor elements such as anisotropic magnetoresistive (AMR), tunneling magnetoresistive (TMR), colossal magnetoresistive (CMR), and GMR, and/or alternative configurations and combinations of sensor elements. Sensor elements 104, 106 and 108 are U-shaped in the embodiment of FIG. 1 but can comprise meanders, strips and/or other configurations and combinations in other embodiments. In one embodiment, sensor elements 104 and 106 each comprise two equal parts, forming four resistors which can be connected in a Wheatstone bridge circuit. In another embodiment, only two resistors are used, and their values are compared (i.e., by injecting a current into each).

First and second magnetic elements 110 and 112 form a magnetic field concentrator in one embodiment, guiding magnetic flux perpendicularly to sensor elements 104, 106 and 108. This helps to ensure an ideal angle between magnetic field lines and sensor elements 104, 106 and 108 and amplifies the flux density by about one order of magnitude. Thus, sensor device 100 comprises an integrated sensor and field concentrator. Magnetic elements 110 and 112 comprise a soft magnetic material, and the length of first and second magnetic elements 110 and 112 is at least slightly longer than first, second and third sensor elements 104, 106 and 108 in one embodiment such that the field concentrating effects of first and second magnetic elements 110 and 112 extend along the entire length of sensor elements 104, 106 and 108. In one embodiment, sensor elements 104, 106 and 108 are pre-magnetized perpendicular to their length such that current flows along the length. The magnetic flux is then concentrated by magnetic elements 110 and 112 perpendicularly to the current flow.

Figure 2:
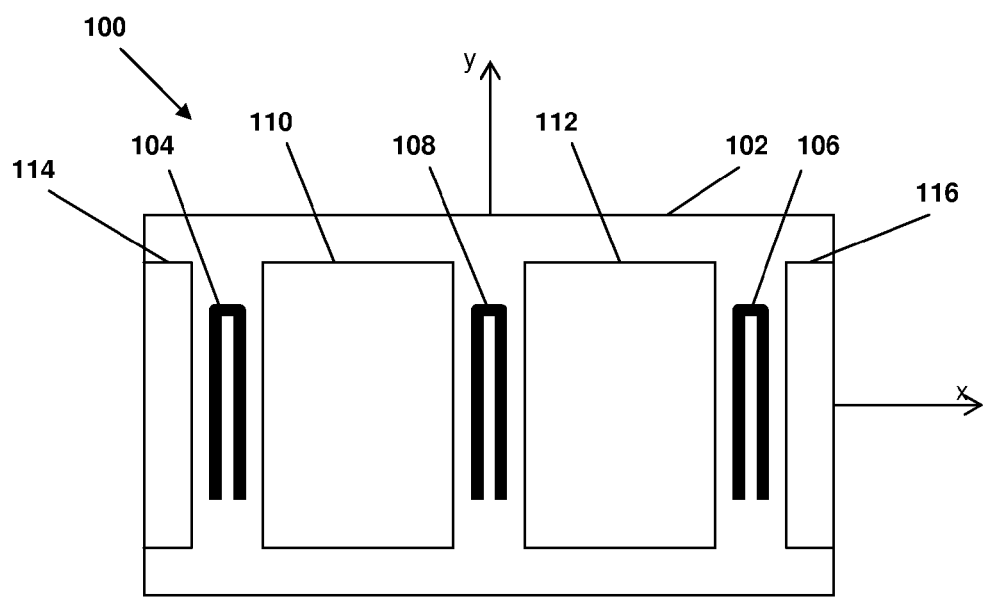
FIG. 2 is a top view of a block diagram of a sensor according to an embodiment.

Another embodiment of sensor device 100 is depicted in FIG. 2. In this embodiment, sensor device 100 comprises additional magnetic elements 114 and 116. The addition of magnetic elements 114 and 116 provides further amplification of magnetic fields on sensor elements 104, 106 and 108.

Figure 3:
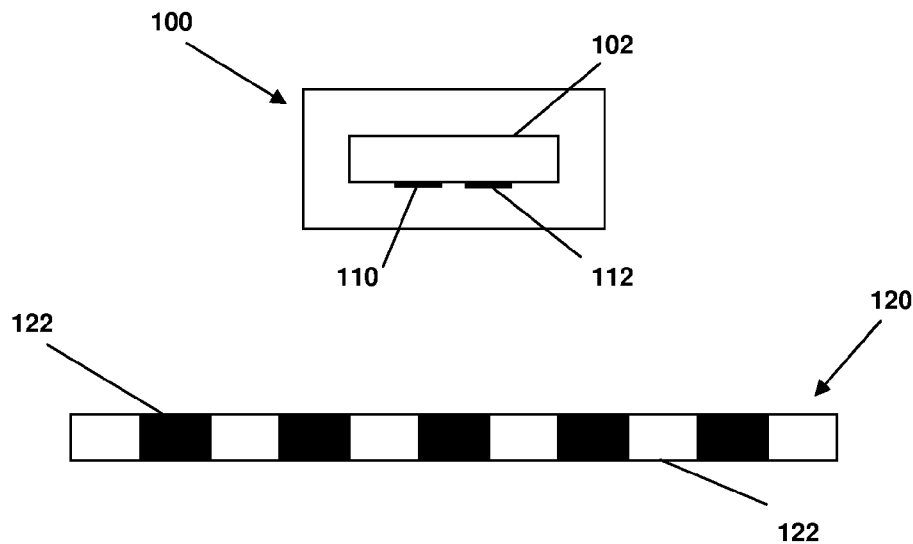
FIG. 3 is a side view of a block diagram of a sensor and a pole wheel according to an embodiment.

In FIG. 3, sensor device 100 of FIG. 1 is depicted in relation to a pole wheel 120. Pole wheel 120 comprises a planar strip about 5 millimeters (mm) wide and 3 mm thick, and each individual pole 122 is about 5 mm long in one embodiment. The remanence of pole wheel 120 is about +/−0.25 T. Sensor device 100 is positioned about 8.5 mm above pole wheel 120. In one embodiment, first and second magnetic elements 110 and 112 of sensor device 100 are about 1.2 mm wide and about 2 mm long. Each magnetic element 110 and 112 is about 10 micrometers (µm) to about 30 µm thick, such as about 20 µm in one embodiment. The gap between first and second magnetic elements 110 and 112 in which sensor element 108 is formed is about 20 µm in one embodiment, although it can also be about 10 µm or less in other embodiments. First and second sensor elements 104 and 106 are spaced apart by about 0.5 mm to about 5 mm or more, such as about 2.5 mm in one embodiment. Other spacings, sizes and configurations and combinations thereof can be used in other embodiments.

In the aforementioned embodiment, the in-plane flux density on sensor element 108 is about 3.65 mT, while sensor elements 104 and 106 are exposed to about 925 µT. In contrast, the flux density on sensor element 108 is only about 90 µT, and sensor elements 104 and 106 exposed to only about 125 µT, in an embodiment in which magnetic elements 110 and 112 are omitted. Magnetic elements 110 and 112 therefore provide amplification factors of about 40 in the flux density on sensor element 108, and about 7 on sensor elements 104 and 106, in one embodiment. Advantageously, sensor elements 104, 106 and 108 and the gaps between magnetic elements 110 and 112 are as narrow as possible to provide the greatest increase in the amplification.

Figure 4:
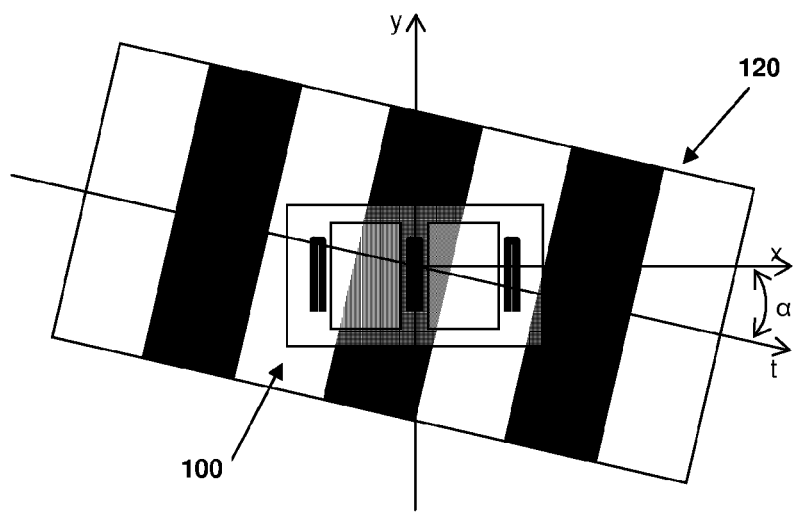
FIG. 4 is a top view of a block diagram of a pole wheel positioned above a sensor according to an embodiment.

The addition of magnetic elements 110 and 112 to sensor device 100 also provides additional advantages. For example, if sensor device 100 is well-aligned with pole wheel 120, there should be no y-component of the magnetic field acting on sensor elements 104, 106, and 108. In fact, the magnetic characteristics of GMR sensor elements, such as sensor elements 104, 106 an 108, are altered if a y-component is superimposed on the x-component (the z-component vertical to die 102 is not relevant in this context). Because of position tolerances, die 102 and/or pole wheel 120 may be slightly tilted with respect to each other, as shown in FIG. 4, and a magnetic field y-component acts on sensor elements 104, 106 and 108. This can introduce inaccuracies in the detection of the exact position of pole wheel 120. If the tangential direction, t, of pole-wheel 120 is misaligned with the x-axis of sensor 100, as shown at α, the decomposition of the magnetic field has a small y-component, which distorts the GMR characteristic.

In one embodiment of the invention, however, magnetic elements 110 and 112 have the additional beneficial effect of shunting this magnetic field y-component. Thus, only the x-component of the magnetic field is amplified by magnetic elements 110 and 112 while the y-component is suppressed. If the permeability of magnetic elements 110 and 112 is infinite, the flux-lines enter and leave perpendicular to the surface of magnetic elements 110 and 112.

Although specific embodiments have been illustrated and described herein for purposes of description of an example embodiment, it will be appreciated by those of ordinary skill in the art that a wide variety of alternate and/or equivalent implementations calculated to achieve the same purposes may be substituted for the specific embodiments shown and described without departing from the scope of the present invention. Those skilled in the art will readily appreciate that the invention may be implemented in a very wide variety of embodiments. This application is intended to cover any adaptations or variations of the various embodiments discussed herein, including the disclosure information in the attached appendices. Therefore, it is manifestly intended that this invention be limited only by the claims and the equivalents thereof.

The invention claimed is:

1. An integrated circuit comprising:
a speed sensor device comprising a first speed xMR sensor element, a second speed xMR sensor element, and a third direction xMR sensor element, the first sensor element spaced apart from the third sensor element by a first gap, and the second sensor element spaced apart from the third sensor element by a second gap; and
a magnetic field concentrator comprising a first magnetic element disposed in the first gap and a second magnetic element disposed in the second gap.

2. The integrated circuit of claim 1, wherein the magnetic field concentrator is configured to guide magnetic flux perpendicularly to the first, second and third sensor elements.

3. The integrated circuit of claim 2, wherein the magnetic flux is provided by an external source.

4. The integrated circuit of claim 1, wherein the xMR sensor elements comprise at least one of an anisotropic magnetoresistive (AMR) sensor element, a tunneling magnetoresistive (TMR) sensor element, a colossal magnetoresistive (CMR) sensor element, or a giant magnetoresistive (GMR) sensor element.

5. The integrated circuit of claim 1, wherein the first, second and third sensor elements comprise at least one of a U-shape, a meander, or a strip.

6. The integrated circuit of claim 1, wherein the first and second gaps are each about 20 micrometers or less.

7. The integrated circuit of claim 6, wherein the first and second gaps are each about 10 micrometers or less.

8. The integrated circuit of claim 1, wherein the magnetic field concentrator further comprises a third magnetic element and a fourth magnetic element.

9. The integrated circuit of claim 1, wherein the first and second sensor elements each comprise two portions forming a Wheatstone bridge circuit.

10. The integrated circuit of claim 1, wherein the first and second magnetic elements comprise a soft magnetic material.

11. The integrated circuit of claim 1, wherein a length of each of the first and second magnetic elements is longer than a length of each of the first, second and third sensor elements.

12. The integrated circuit of claim 1, wherein the first and second sensor elements are spaced apart by about 0.5 millimeters to about 5 millimeters.

13. The integrated circuit of claim 1, wherein the first and second sensor elements are spaced apart by about 2.5 millimeters.

14. The integrated circuit of claim 1, wherein the sensor device and the magnetic field concentrator are disposed on a die.

15. A method comprising:
providing an integrated circuit comprising a speed sensor and a magnetic field concentrator, the speed sensor comprising a first speed xMR sensor element, a second speed xMR sensor element, and a third direction xMR sensor element;

exposing the integrated circuit to a magnetic field; and guiding a magnetic flux perpendicularly to the speed sensor by the magnetic field concentrator.

16. The method of claim 15, further comprising:

shunting an undesired magnetic field component by the magnetic field concentrator.

17. An integrated circuit comprising:

a first speed xMR sensor element;

a second speed xMR sensor element spaced apart from the first sensor element;

a third direction xMR sensor element arranged between the first and second speed xMR sensor elements;

a first magnetic element arranged between the first and third sensor elements; and a second magnetic element arranged between the second and third sensor elements and forming a magnetic field concentrator in combination with the first magnetic element.

18. The integrated circuit of claim 17, wherein the first, second and third sensor elements form a speed sensor.

19. The integrated circuit of claim 17, wherein the magnetic field concentrator is configured to guide magnetic flux in a direction perpendicular to the first, second and third sensor elements.

20. The integrated circuit of claim 17, wherein the first, second and third sensor elements have a first length, and wherein the first and second magnetic elements have a second length longer than the first length.

21. An integrated circuit comprising:

a speed sensor device comprising at least two xMR sensor elements spaced apart from each other on a die to form a first gap and at least one additional xMR sensor element comprising a direction xMR sensor element disposed in the first gap between the at least two xMR sensor elements; and a magnetic field concentrator disposed in the first gap and configured to guide magnetic flux from an external source in a direction perpendicular to the at least two xMR sensor elements.

22. The integrated circuit of claim 21, wherein the at least two xMR sensor elements comprise speed xMR sensor elements, and wherein the magnetic field concentrator comprises first and second magnetic layers, the first magnetic layer disposed in the first gap between one of the at least two xMR sensor elements and at least one additional sensor element and the second magnetic layer disposed in the first gap between another one of the at least two xMR sensor elements and the at least one additional sensor element.

23. The integrated circuit of claim 21, wherein the at least two xMR sensor elements are selected from the group consisting of an anisotropic magnetoresistive (AMR) sensor element, a tunneling magnetoresistive (TMR) sensor element, a colossal magnetoresistive (CMR) sensor element, and a giant magnetoresistive (GMR) sensor element.

* * * * *